(12) United States Patent
Sandow et al.

(10) Patent No.: US 12,074,212 B2
(45) Date of Patent: Aug. 27, 2024

(54) SEMICONDUCTOR DEVICE INCLUDING A PLURALITY OF TRENCHES

(71) Applicant: Infineon Technologies AG, Neubiberg (DE)

(72) Inventors: Christian Philipp Sandow, Haar (DE); Matteo Dainese, Munich (DE)

(73) Assignee: Infineon Technologies AG, Neubiberg (DE)

( * ) Notice: Subject to any disclaimer, the term of this patent is extended or adjusted under 35 U.S.C. 154(b) by 254 days.

(21) Appl. No.: 17/391,562

(22) Filed: Aug. 2, 2021

(65) Prior Publication Data

US 2022/0045200 A1   Feb. 10, 2022

(30) Foreign Application Priority Data

Aug. 5, 2020   (DE) .......................... 102020120679.8

(51) Int. Cl.
 *H01L 29/739* (2006.01)
 *H01L 29/06* (2006.01)
 *H01L 29/66* (2006.01)

(52) U.S. Cl.
 CPC ...... *H01L 29/7397* (2013.01); *H01L 29/0696* (2013.01); *H01L 29/66333* (2013.01)

(58) Field of Classification Search
 CPC ............. H01L 29/7397; H01L 29/0696; H01L 29/66333

USPC ......................................................... 257/139
See application file for complete search history.

(56) References Cited

U.S. PATENT DOCUMENTS

| 9,105,679 | B2* | 8/2015 | Laven ................. H01L 29/7397 |
| 2015/0091052 | A1* | 4/2015 | Laven ................. H01L 29/0821 |
| | | | 438/135 |
| 2017/0330964 | A1* | 11/2017 | Siemieniec .......... H01L 29/4238 |
| 2018/0033705 | A1* | 2/2018 | Philippou ........ H01L 21/823475 |
| 2018/0323294 | A1 | 11/2018 | Okuda et al. |
| 2019/0296110 | A1* | 9/2019 | Meiser ................ H01L 29/7397 |

FOREIGN PATENT DOCUMENTS

| DE | 102014117364 A1 | 5/2015 |
| DE | 102016113837 A1 | 2/2018 |
| DE | 102016117264 A1 | 3/2018 |
| JP | 2011176244 A | 9/2011 |

* cited by examiner

*Primary Examiner* — Igwe U Anya
(74) *Attorney, Agent, or Firm* — Murphy, Bilak & Homiller, PLLC

(57) ABSTRACT

A semiconductor device is proposed. The semiconductor device includes a plurality of trenches extending into in a semiconductor body from a first main surface. A first group of the plurality of trenches includes a gate electrode. A second group of the plurality of trenches includes a source electrode. A third group of the plurality of trenches includes an auxiliary electrode. The source electrode is electrically coupled to a source contact area via a source wiring line and the auxiliary electrode. The source wiring line and the auxiliary electrode are electrically connected in series between the source contact area and the source electrode.

10 Claims, 7 Drawing Sheets

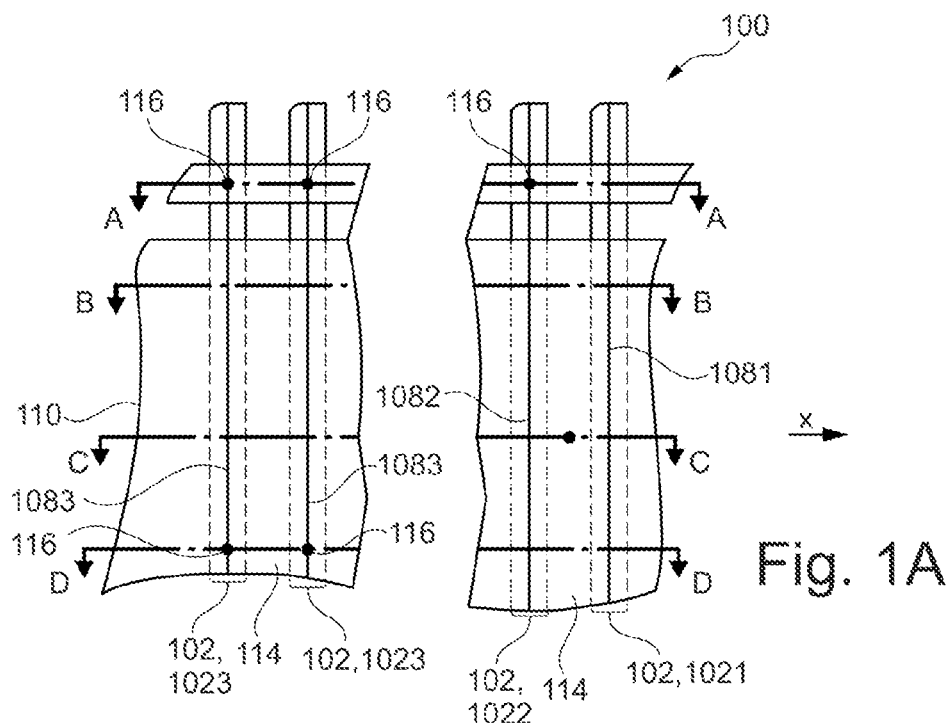
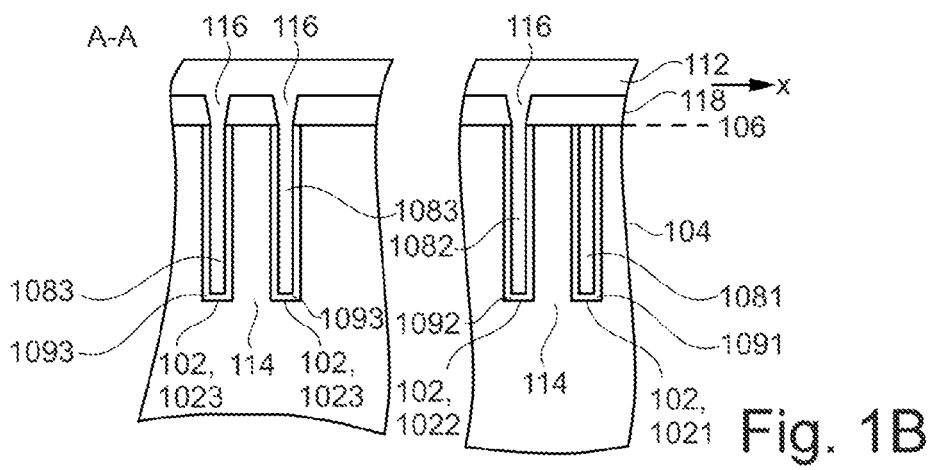
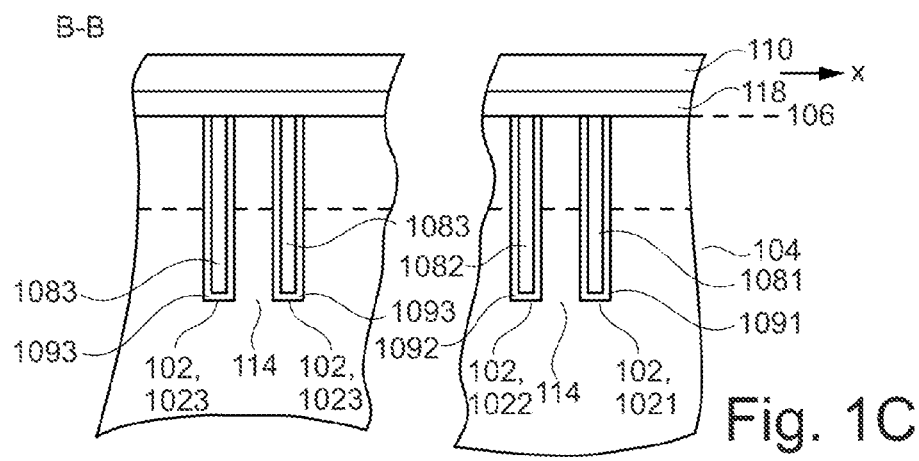

SEMICONDUCTOR DEVICE INCLUDING A PLURALITY OF TRENCHES

TECHNICAL FIELD

The present disclosure is related to semiconductor devices, in particular to semiconductor devices including a plurality of trenches.

BACKGROUND

In semiconductor switching devices like IGBTs (insulated gate bipolar transistors) mobile charge carriers flood a low-doped drift region and form a charge carrier plasma that provides a low on-state resistance. When switching between an on- and off-state by gate electrodes in trenches, parasitic capacitances have an impact on the overall switching behavior of the device. Undesired effects such as turn-on losses may result. Thus, semiconductor device technology development is challenging for meeting target demands on switching characteristics of semiconductor trench devices.

There is a need to improve switching characteristics of semiconductor trench devices.

SUMMARY

An example of the present disclosure relates to a semiconductor device. The semiconductor device includes a plurality of trenches extending into in a semiconductor body from a first main surface. A first group of the plurality of trenches includes a gate electrode. A second group of the plurality of trenches includes a source electrode. A third group of the plurality of trenches includes an auxiliary electrode. The source electrode is electrically coupled to a source contact area via a source wiring line and the auxiliary electrode. The source wiring line and the auxiliary electrode are electrically connected in series between the source contact area and the source electrode.

Another example of the present disclosure relates to another semiconductor device. The semiconductor device includes a plurality of trenches extending into a semiconductor body from a first main surface. A first group of the plurality of trenches includes a gate electrode. A second group of the plurality of trenches includes a source electrode. The source electrode is subdivided into at least a first part and a second part. A conductance per unit length of the first part along a longitudinal direction of the source electrode is smaller than a conductance per unit length of the second part along the longitudinal direction of the source electrode. The second part is electrically coupled to a source contact area via the first part. The semiconductor device further includes a mesa region bounded by a trench of the first group and a trench of the second group. The mesa region includes a source region electrically connected to the source contact area.

Another example of the present disclosure relates to another semiconductor device. The semiconductor device includes a plurality of trenches extending into in a semiconductor body from a first main surface. A first group of the plurality of trenches includes a gate electrode. A second group of the plurality of trenches includes a source electrode. The source electrode in the second group is electrically coupled to a source contact area via a source wiring line and a resistor placed on a substrate different from the semiconductor body. The source wiring line and the resistor are connected in series between the source contact area and the source electrode in the second group of the trenches.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate embodiments of semiconductor devices, e.g. vertical power semiconductor devices and together with the description serve to explain principles of the embodiments. Further embodiments are described in the following detailed description and the claims.

FIGS. 1A to 1F are schematic plan and cross-sectional views for illustrating an example of a semiconductor device including a resistive coupling between a source electrode and a source contact area.

DETAILED DESCRIPTION

Figure 1D:
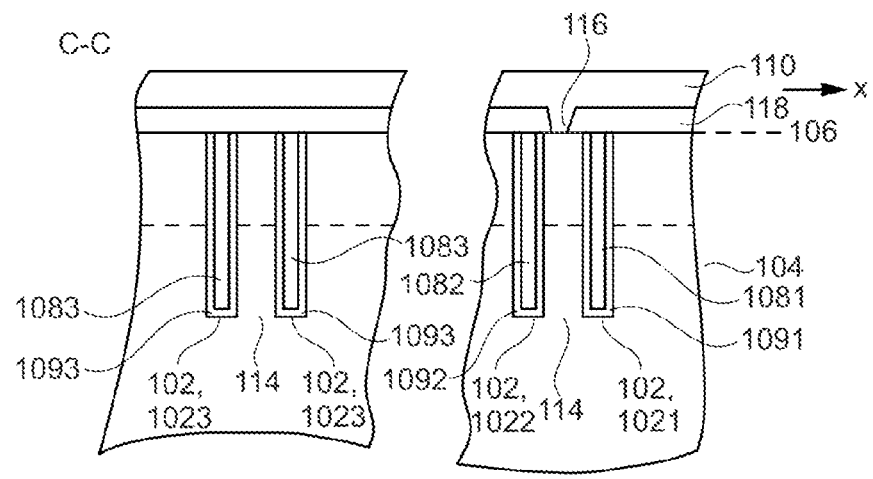

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive connection between electrically connected elements, for example a direct contact between the concerned elements or a low-resistive connection via a metal and/or heavily doped semiconductor material. The term "electrically coupled" includes that one or more intervening element(s) adapted for signal and/or power transmission may be connected between the electrically coupled elements, for example, elements that are controllable to temporarily provide a low-resistive connection in a first state and a high-resistive electric decoupling in a second state. An ohmic contact is a non-rectifying electrical junction with a linear or almost linear current-voltage characteristic.

Ranges given for physical dimensions include the boundary values. For example, a range for a parameter y from a to b reads as a≤y≤b. A parameter y with a value of at least c reads as c≤y and a parameter y with a value of at most d reads as y≤d.

The term "on" is not to be construed as meaning only "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

An example of a semiconductor device may include a plurality of trenches extending into in a semiconductor body from a first main surface. A first group of the plurality of trenches may include a gate electrode. A second group of the plurality of trenches may include a source electrode. A third group of the plurality of trenches may include an auxiliary electrode. The source electrode may be electrically coupled to a source contact area via a source wiring line and the auxiliary electrode. The source wiring line and the auxiliary electrode may be electrically connected in series between the source contact area and the source electrode.

The semiconductor device may be a vertical power semiconductor device having a load current flow between a first load terminal at the first main surface and a second load terminal at a second main surface opposite to the first main surface. The semiconductor device may be a vertical power semiconductor IGBT (insulated gate bipolar transistor), or a power semiconductor reverse conducting (RC) IGBT or a power semiconductor transistor such as a power semiconductor IGFET (insulated gate field effect transistor, e.g. a metal oxide semiconductor field effect transistor). The vertical power semiconductor device may be configured to conduct currents of more than 1A or more than 30 A or even more than 100 A and may be further configured to block voltages between load terminals, e.g. between emitter and collector of an IGBT, or between drain and source of a MOSFET in the range of several hundreds of up to several thousands of volts, e.g. 400 V, 650V, 1.2 kV, 1.7 kV, 3.3 kV, 4.5 kV, 5.5 kV, 6 kV, 6.5 kV. The blocking voltage may correspond to a voltage class specified in a datasheet of the power semiconductor device, for example.

The semiconductor body may include or consist of a semiconductor material from the group IV elemental semiconductors, IV-IV compound semiconductor material, III-V compound semiconductor material, or II-VI compound semiconductor material. Examples of semiconductor materials from the group IV elemental semiconductors include, inter alia, silicon (Si) and germanium (Ge). Examples of IV-IV compound semiconductor materials include, inter alia, silicon carbide (SiC) and silicon germanium (SiGe). Examples of III-V compound semiconductor material include, inter alia, gallium arsenide (GaAs), gallium nitride (GaN), gallium phosphide (GaP), indium phosphide (InP), indium gallium nitride (InGaN) and indium gallium arsenide (InGaAs). Examples of II-VI compound semiconductor materials include, inter alia, cadmium telluride (CdTe), mercury-cadmium-telluride (CdHgTe), and cadmium magnesium telluride (CdMgTe). For example, the semiconductor body may be a magnetic Czochralski, MCZ, or a float zone (FZ) or an epitaxially deposited silicon semiconductor body.

For example, the gate electrode in the first group of the plurality of trenches may be electrically insulated from a surrounding part of the semiconductor body, e.g. from a body region, by a dielectric, e.g. a gate dielectric. The dielectric may include one layer or a combination of layers, e.g. a layer stack of dielectric layers, for example oxide layers such as thermal oxide layers or deposited oxide layers, e.g. undoped silicate glass (USG), phosphosilicate glass (PSG), boron silicate glass (BSG), borophosphosilicate glass (BPSG), nitride layers, high-k dielectric layers or low-k dielectric layers. The gate electrode may include one electrode material or a combination of electrode materials, for example a doped semiconductor material (e.g. a highly doped semiconductor material) such as doped polycrystalline silicon, metal or metal compounds. Similar to the gate electrode in the first group, the source electrode in the second group of the plurality of trenches may also be electrically insulated from a surrounding part of the semiconductor body by a dielectric. The source electrode may include one electrode material or a combination of electrode materials, for example a doped semiconductor material (e.g. a highly doped semiconductor material) such as doped polycrystalline silicon, metal or metal compounds. Similar to the gate electrode in the first group and similar to the second electrode in the second group, the auxiliary electrode in the third group of the plurality of trenches may also be electrically insulated from a surrounding part of the semiconductor body by a dielectric. The auxiliary electrode may include one electrode material or a combination of electrode materials, for example a doped semiconductor material (e.g. a highly doped semiconductor material) such as doped polycrystalline silicon, metal or metal compounds. The plurality of trenches in the first to third group or parts thereof may be concurrently formed, e.g. by common etch process(es). Likewise, also the gate electrode, the source electrode and the auxiliary electrode may, at least partly, be concurrently formed, e.g. by a common layer deposition process(es).

All or some parts of each of the trenches of the first to third group may be stripe-shaped. Stripe-shaped parts of the trenches of the first to third group may extend in parallel along a longitudinal direction, e.g. a first lateral direction.

The source wiring line may be arranged at an edge of an active area. In the active area, a load current can enter the semiconductor body from a load terminal above the first main surface. For example, the load terminal may be the source contact area and the source wiring line may be laterally spaced from the source contact area. Although the source electrode of the second group may at least in part be arranged directly below the source contact area, the source electrode of the second group may be electrically coupled to the source contact area via the source wiring line and the auxiliary electrode in the third group instead of being directly electrically connected to the source contact area by a contact above the source electrode. This may allow for reducing a shielding effect of the trenches of the second group by introducing a resistive coupling between a potential of the source electrode in the trenches of the second group and the potential of the source contact area. This resistive coupling may allow for suppressing a turn-on voltage tail, and consequently, to reduce turn-on losses.

For example, the semiconductor device may include a drift region between the first main surface and the second main surface. An impurity concentration in the drift region may gradually or in steps increase or decrease with increasing distance to the first main surface at least in portions of its vertical extension. According to other examples the impurity concentration in the drift region may be approximately uniform. For IGBTs based on silicon, a mean impurity concentration in the drift region may be between $5 \times 10^{12}$ $cm^{-3}$ and $1 \times 10^{15}$ $cm^{-3}$, for example in a range from $1 \times 10^{13}$ $cm^{-3}$ to $2 \times 10^{14}$ $cm^{-3}$. In the case of a semiconductor device based on SiC, a mean impurity concentration in the drift region may be between $5 \times 10^{14}$ cm$^{-3}$ and $1 \times 10^{17}$ cm$^{-3}$, for example in a range from $1 \times 10^{15}$ cm$^{-3}$ to $2 \times 10^{16}$ cm$^{-3}$. A vertical extension of the drift region may depend on voltage blocking requirements, e.g. a specified voltage class, of the vertical power semiconductor device. When operating the vertical power semiconductor device in voltage blocking mode, a space charge region may vertically extend partly or totally through the drift region depending on the blocking voltage applied to the vertical power semiconductor device. When operating the vertical power semiconductor device at or close to the specified maximum blocking voltage, the space charge region may reach or penetrate into a field stop region. The field stop region is configured to prevent the space charge region from further reaching to the cathode or collector at the second main surface of the semiconductor body. In this manner, the drift or base region may be formed using desired low doping levels and with a desired thickness while achieving soft switching for the semiconductor device thus formed.

For example, the source wiring line and the source contact area may be separate parts of a patterned wiring layer. For example, the source wiring line and the source contact area may correspond to one wiring level of a wiring area above the first main surface, wherein the one wiring level of the wiring area may be located closest to the first main surface in case of multiple wiring levels. The wiring area may include one or more than one, e.g. two, three, four or even more wiring levels. Each wiring level may be formed by a single one or a stack of conductive layers, e.g. metal layer(s). The wiring levels may be lithographically patterned, for example. Between stacked wiring levels, an intermediate dielectric may be arranged. Contact plug(s) or contact line(s) may be formed in openings in the intermediate dielectric to electrically connect parts, e.g. metal lines or contact areas, of different wiring levels to one another.

For example, a ratio between a number of trenches in the second group and a number of trenches in the third group may range from 100 to 100,000. The ratio may allow for adjusting a voltage drop of the resistive coupling between the source electrode and the source contact area, for example.

For example, the source wiring line may extend in parallel to at least two edges of the source contact area. For example, some or all of the trenches of the second group may be electrically connected to the source wiring line at opposite ends of the trenches. Some or all of the trenches of the second group may also be electrically connected to the source wiring line at one end of the trenches.

For example, the source wiring line may laterally surround at least a quarter of a circumference of the source contact area. For this example, some or all of the trenches of the second group may be electrically connected to the source wiring line at one end of the trenches. Reducing the degree of circulation of the source contact area by the source wiring line may allow for implementing an area efficient resistive coupling between the source contact area and the source electrode in the trenches of the second group, for example.

For example, the semiconductor device may further include a gate wiring line. The source wiring line may be arranged between the gate wiring line and the source contact area. The gate wiring line may extend in parallel to at least two edges of the source wiring line. The gate wiring line and the source wiring line may be separate parts of a patterned wiring layer. For example, the source wiring line and the gate wiring line may be formed in one wiring level by lithographically patterning the one or more conductive layers of the wiring level.

For example, the semiconductor device may further include a second source wiring line. The second source wiring line may be merged with the source contact area. The source wiring line may be arranged between the second source wiring line and the source contact area. The source wiring line may be completely or predominantly, e.g. more than 50% of its circumference, laterally surrounded by the second source wiring line and the source contact area. For example, the semiconductor device may include a plurality of contacts arranged between the second source wiring line and the first main surface. The plurality of contacts may electrically connect a plurality of mesa regions to the second source wiring line. Each of the plurality of mesa regions may be laterally confined by neighboring trenches. Electrically connecting the second source wiring line to the mesa regions may allow for improving commutation ruggedness of the semiconductor device, for example.

The semiconductor device may further include a fourth group of the plurality of trenches. Trenches of the fourth group may include a second source electrode. Other than the source electrode of the second group which is resistively coupled to the source contact area, the second source electrode in the trenches of the fourth group may be electrically connected to the source contact area by contacts arranged between source contact area and the second source electrode, and/or by contacts arranged between the second source wiring line and the second source electrode.

For example, the auxiliary electrodes in the third group are connected in parallel between the source wiring line and the source contact area. A total resistance of the auxiliary electrodes connected in parallel ranges from 50 to 500 times a resistance between the gate electrode and a gate terminal, e.g. a gate pin or gate pad, multiplied by a ratio between a total sum of longitudinal extensions of all trenches of the first group and a total sum of longitudinal extensions of all trenches of the second group.

For example, the semiconductor device may include a mesa region laterally confined by a trench of the first group and a trench of the second group, wherein the mesa region includes a source region. The source region in the mesa region may be electrically connected to the source contact area by contacts adjoining a bottom side of the source contact area.

For example, a conductance per unit length of the auxiliary electrode along a longitudinal direction of the plurality of trenches may be smaller than a conductance per unit length of the gate electrode along the longitudinal direction of the plurality of trenches. For example, a material of the auxiliary electrode may have a larger electrical resistivity than a material of the gate electrode. For example, material or material combinations of the auxiliary electrode and the gate electrode may differ. As an alternative or in addition, a same semiconductor material may be used for the auxiliary electrode and the gate electrode, e.g. polycrystalline silicon, but a doping concentration of the semiconductor material of the gate electrode may be larger than a doping concentration of the semiconductor material of the auxiliary electrode. As an alternative or in addition, a cross-sectional area of the auxiliary electrode, perpendicular to the longitudinal direction of the trenches, may at least partly, e.g. in at least some segments of the electrode along the longitudinal direction, be smaller than a cross-sectional area of the gate electrode.

Another example of a semiconductor device may include a plurality of trenches extending into in a semiconductor body from a first main surface. A first group of the plurality of trenches may include a gate electrode. A second group of the plurality of trenches may include a source electrode. The source electrode may be subdivided into at least a first part and a second part. A conductance per unit length of the first part along a longitudinal direction of the source electrode may be smaller than a conductance per unit length of the second part along the longitudinal direction of the source electrode. The second part may be electrically coupled to a source contact area via the first part. The semiconductor device may further include a mesa region bounded by a trench of the first group and a trench of the second group. The mesa region may include a source region electrically connected to the source contact area.

Similar to the auxiliary electrode in the trenches of the third group described in the above examples, the first part of the source electrode may allow for a resistive coupling between the second part of the source electrode and the source contact area. This resistive coupling may allow for suppressing a turn-on voltage tail, and consequently, to reduce turn-on losses.

For example, a material of the first part of the source electrode may have a larger electrical resistivity than a material of the first part of the source electrode. For example, material or material combinations of the first part of the source electrode and the second part of the source electrode may differ. As an alternative or in addition, a semiconductor material may be used for the first part of the source electrode and for the second part of the source electrode, e.g. polycrystalline silicon, but a net doping concentration of the semiconductor material of the second part of the source electrode may be larger than a net doping concentration of the semiconductor material of the first part of the source electrode. As an alternative or in addition, a cross-sectional area of the first part of the source electrode, perpendicular to the longitudinal direction of the trenches, may at least partly, e.g. in at least some segments of the first part of the source electrode along the longitudinal direction, be smaller, e.g. due to a smaller lateral and/or vertical extent, than a cross-sectional area of the second part of the source electrode.

For example, a lateral extent of the first part along the longitudinal direction of the source electrode may be smaller than a lateral extent of the second part along the longitudinal direction of the source electrode. For example, the second part of the source electrode may be predominantly, e.g. more than 50%, arranged below the source contact area.

For example, a vertical extent of the first part of the source electrode may be smaller than a vertical extent of the second part of the source electrode.

For example, a width of the first part of the source electrode at the first main surface may be smaller than a width of the second part of the source electrode at the first main surface.

Another example of a semiconductor device may include a plurality of trenches extending into in a semiconductor body from a first main surface. A first group of the plurality of trenches may include a gate electrode. A second group of the plurality of trenches may include a source electrode. The source electrode in the second group may be electrically coupled to a source contact area via a source wiring line and a resistor placed on a substrate different from the semiconductor body. The source wiring line and the resistor may be connected in series between the source contact area and the source electrode in the second group. For example, the source wiring line may merge with an auxiliary source contact area. A first bond wire may electrically connect the auxiliary source contact area over the semiconductor body and a first end of the resistor on the substrate. A second bond wire may electrically connect the auxiliary source contact area over the semiconductor body and a second end of the resistor on the substrate.

Similar to the auxiliary electrode in the trenches of the third group described in the above examples, and similar to the first part of the source electrode described in the above examples, the resistor placed on a substrate different from the semiconductor body may allow for a resistive coupling between the source electrode in the trenches of the second group and the source contact area. This resistive coupling may allow for suppressing a turn-on voltage tail, and consequently, to reduce turn-on losses.

Another example of a semiconductor device may include a plurality of trenches extending into in a semiconductor body from a first main surface. A plurality of trenches may extend into in a semiconductor body from a first main surface. A first group of the plurality of trenches may include a gate electrode. A second group of the plurality of trenches may include a source electrode. A mesa region may be laterally confined by a first trench of the first group and a second trench of the second group. The mesa region may include a source region. The source region may be electrically coupled to a source contact area, e.g. the first load terminal, via a first conductive path. The source electrode in the second group of the plurality of trenches may be electrically coupled to the source contact area, e.g. a first load terminal, via a second conductive path. The gate electrode in the first group of the plurality of trenches may be electrically coupled to a gate contact or gate terminal by a gate conductive path. The second conductive path may have a resistance of at least a factor of five, or a factor of ten higher than the gate conductive path. The second conductive path may have a resistance of not more than a factor of hundred, or not more than a factor of thousand higher than the gate conductive path. The gate conductive path may have a resistance of at least a factor of thousand higher than the first conductive path.

For example, a fourth group of the plurality of trenches may include a second source electrode. The second source electrode of the fourth group of the plurality of trenches trench may be electrically coupled to the source contact area or load terminal via a third conductive path. The third conductive path may have a resistance smaller than the gate conductive path Another example of a semiconductor device may be an IGBT including a semiconductor body electrically coupled to a first load terminal and to a second load terminal. The IGBT may include a drift region configured to conduct a load current between the first load terminal and the second load terminal. The drift region may have a first conductivity type. The IGBT may further include a gate trench having a gate trench electrode. The IGBT may further include a source trench having a source trench electrode electrically coupled to the first load terminal. The IGBT may further include a mesa region. The mesa region may include a source region of the first conductivity type that is electrically connected to the first load terminal. The source region may be arranged adjacent to the gate trench. The gate trench electrode may be configured to receive a control signal from a control terminal of the IGBT and to control the load current in the mesa region. The source trench may be arranged on a side of the mesa region that is opposite to the side where the gate trench is located, e.g. the mesa region may be laterally confined by the gate trench and the source trench. The source trench electrode may be electrically coupled to the first load terminal via a first resistive path. In an on-state of the IGBT, the IGBT may be configured to conduct the load current in the forward direction and the gate electrode is set to a first, e.g. on- gate voltage. In an off-state of the IGBT, the IGBT is configured to block the load current in the forward direction and the gate electrode is set to a second, e.g. off-, gate voltage. In a switching state where the IGBT switches from the off- to the on-state during a switching time, a voltage of the source trench electrode may deviate from a voltage of the first load terminal by at least 30% of a gate voltage difference between the first gate voltage and the second gate voltage for at least 30% of the switching time.

The examples and features described above and below may be combined.

In the following, further examples of semiconductor devices are explained in connection with the accompanying drawings. Functional and structural details described with respect to the examples above shall likewise apply to the exemplary embodiments illustrated in the figures and described further below.

FIG. 1A is a schematic plan view illustrating an example of a semiconductor device 100. FIG. 1B is a schematic cross-sectional view along intersection line AA of FIG. 1A. FIG. 1C is a schematic cross-sectional view along intersection line BB of FIG. 1A.

Referring to the schematic views of FIGS. 1A to 1E, the semiconductor device 100 includes a plurality of trenches 102 extending into in a semiconductor body 104 from a first main surface 106. A first group 1021 of the plurality of trenches 102 includes a gate electrode 1081. A second group 1022 of the plurality of trenches 102 includes a source electrode 1082. A third group 1023 of the plurality of trenches 102 includes an auxiliary electrode 1083. Trench dielectrics 1091, 1092, 1093 electrically separate the electrodes 1081, 1082, 1083 from a surrounding part of the semiconductor body 104.

The source electrode 1082 is electrically coupled to a source contact area 110, e.g. a first load terminal of a vertical power semiconductor device, via a source wiring line 112 and the auxiliary electrode 1083. The source wiring line 112 and the auxiliary electrode 1083 are electrically connected in series between the source contact area 110 and the source electrode 1082. In the figures, contacts 116 provide an electric contact between regions of the semiconductor body 104 or electrodes in the trenches 102 and a first wiring level, e.g. the source wiring line 112 or the source contact area 110. An intermediate dielectric 118 is arranged between the first wiring level and the semiconductor body 104.

Mesa regions 114 are each confined along a lateral direction x by neighboring two of the trenches 102. Apart from the trenches 102 illustrated in the schematic views of FIGS. 1A to 1C, additional trenches may be arranged, e.g. between the trench 102 of the second group 1022 and the trenches 102 of the third group 1023.

The trenches 102 of the first and second group may be arranged in a regular pattern next to each other as part of active transistor cells within the active area.

As is schematically illustrated in the cross-sectional view of FIG. 1D, the mesa regions 114 may be electrically connected to the source contact area 110 via contacts 116. This enables an electric contact between the source contact area 110 and active transistor cells, e.g. source and body regions of active transistor cells, for example.

Figure 1E:
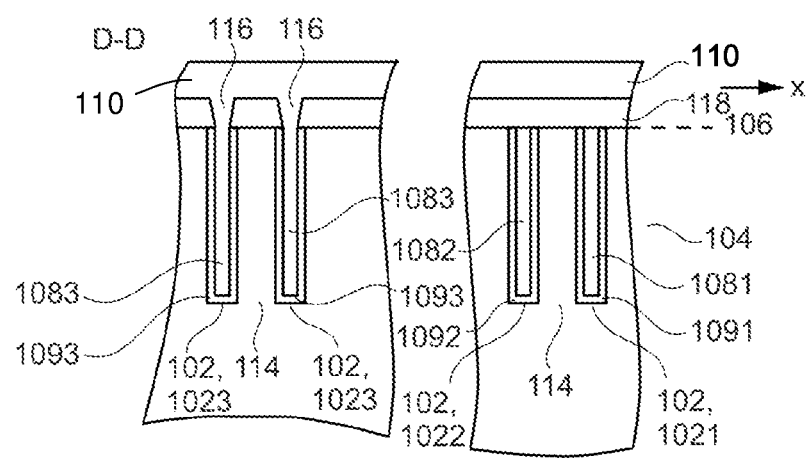

As is schematically illustrated in the cross-sectional view of FIG. 1E, the auxiliary electrode 1083 is electrically connected to the source contact area 110 via contacts 116.

Figure 1F:
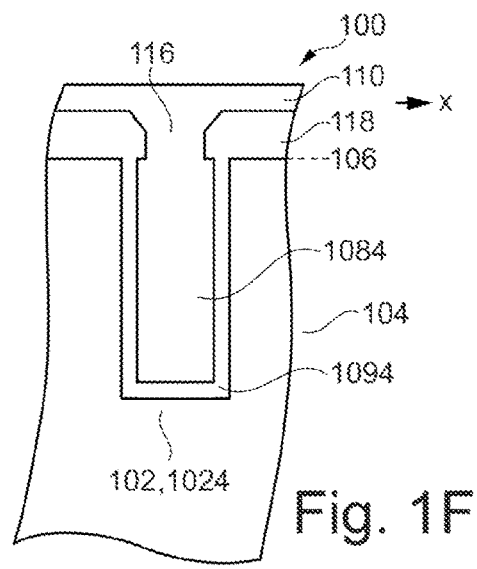

Referring to the schematic cross-sectional view of FIG. 1F, the semiconductor device 100 may further include, e.g. between the trench 102 of the second group 1022 and the trenches 102 of the third group 1023 illustrated in FIG. 1C, a fourth group 1024 of the plurality of trenches 102. Trenches 102 of the fourth group 1024 include a second source electrode 1084 and a trench dielectric 1094. Other than the source electrode 1082 of the second group 1022 of the trenches 122 which are resistively coupled to the source contact area 110 by the auxiliary electrode 1083 of the third group 1023 of the trenches 1022 (see e.g. FIG. 1A), the second source electrode 1084 in the trenches 102 of the fourth group 1024 are electrically connected to the source contact area 110 by contacts 116 arranged between the source contact area 110 and the second source electrode 1084. In some examples, trenches of the fourth group may be arranged between trenches of the second group. For example, trenches of the fourth group may be more distant to trenches of the first group, e.g. gate trenches, than trenches of the second group.

The semiconductor device may further include additional trenches not belonging to the first, second, third or fourth groups.

Various layouts of the trenches 102 may be implemented in an active area, e.g. transistor cell array, of the semiconductor device 100.

For example, mesa regions 114 may be confined along the lateral direction x by a trench 102 of the first group 1021 of trenches 102 and any one of a trench 102 of the second group 1022, or of the fourth group 1024. Likewise, mesa regions 114 may be confined along the lateral direction x by a trench 102 of the second group 1022 of trenches 102 and any one of a trench 102 of the first group 1021, or of the third group 1023 or of the fourth group 1024 or any of the additional trenches. Likewise, mesa regions 114 may be confined along the lateral direction x by a trench 102 of the third group 1023 of trenches 102 and any one of a trench 102 of the second group 1022 or of the fourth group 1024. Likewise, mesa regions 114 may be confined along the lateral direction x by a trench 102 of the fourth group 1024 of trenches 102 and any one of a trench 102 of the first group 1021, or of the second group 1022 or of the third group 1023. In the mesa regions, semiconductor regions, e.g. source region(s), body region(s), body contact region(s) may be arranged (not illustrated in FIGS. 1A to 1F) for forming transistor cells, for example.

Exemplary layouts are illustrated in the schematic top views of FIGS. 2A to 2I.

Figure 2A:
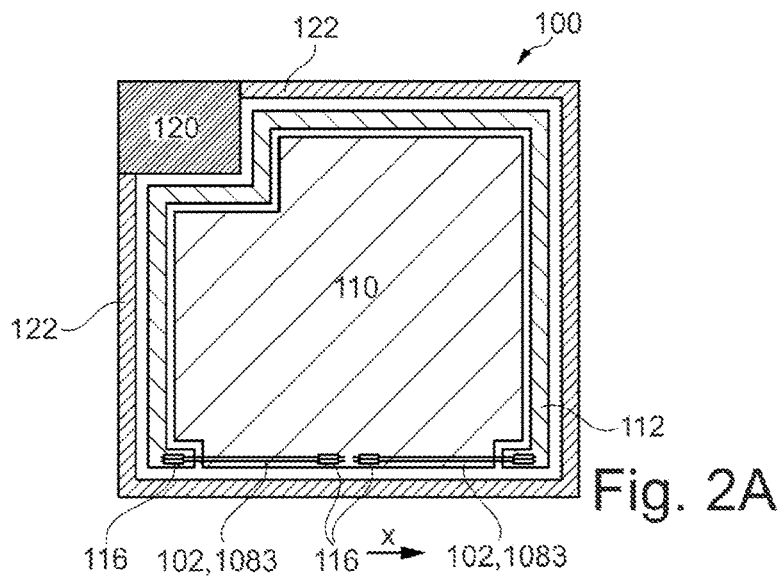
FIGS. 2A to 2I are schematic layouts for illustrating examples of resistive coupling between a source electrode and a source contact area.
Figure 2B:
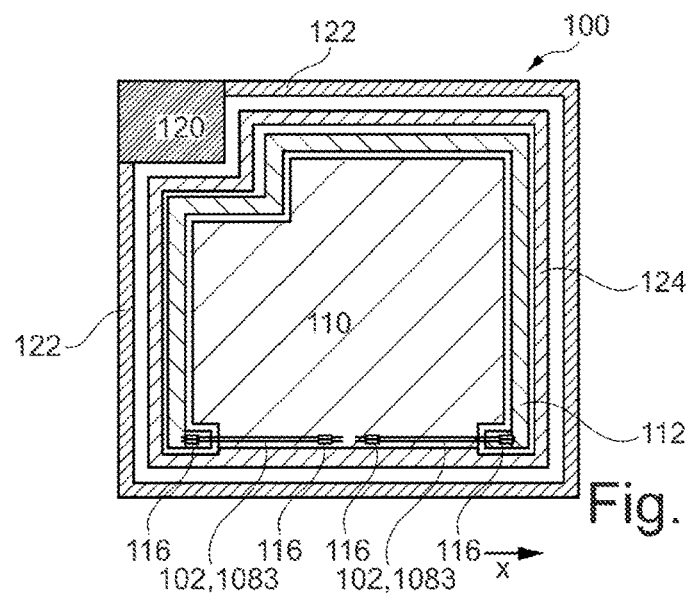
Figure 2C:
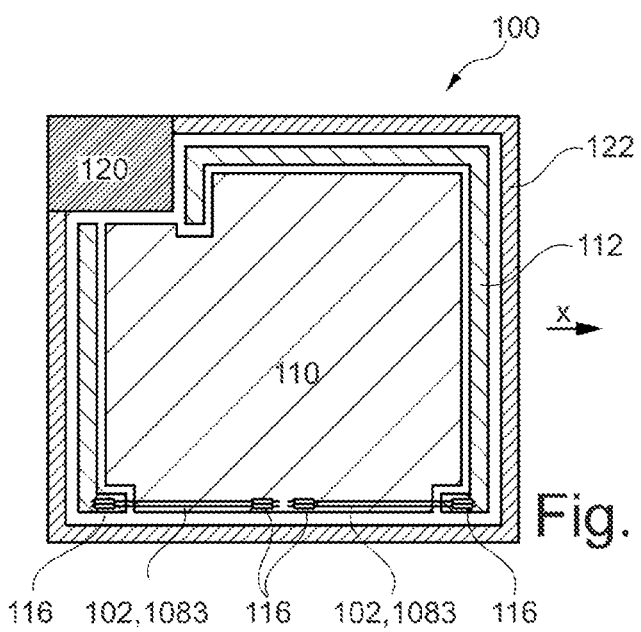
Figure 2D:
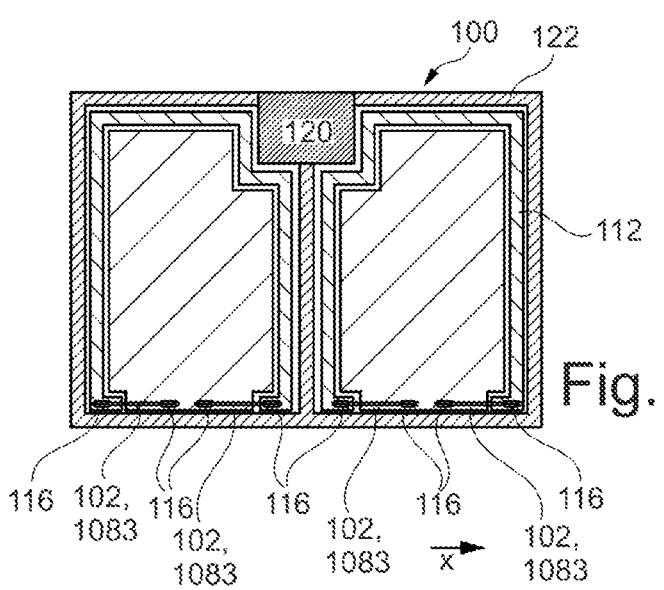
Figure 2E:
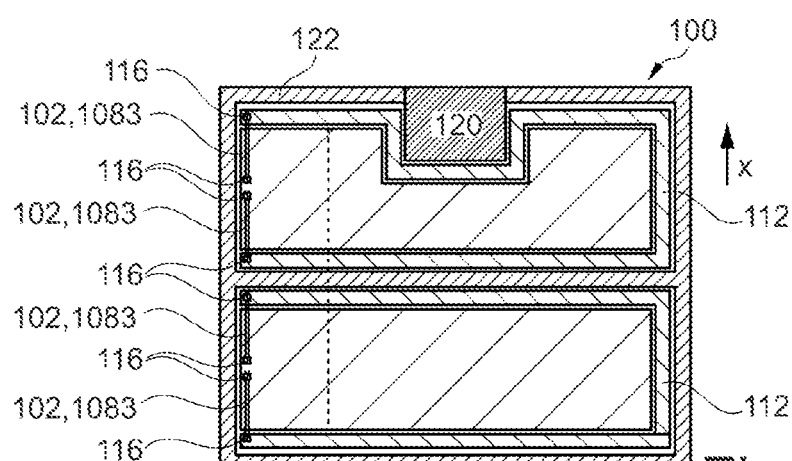
Figures 2F, 2G:
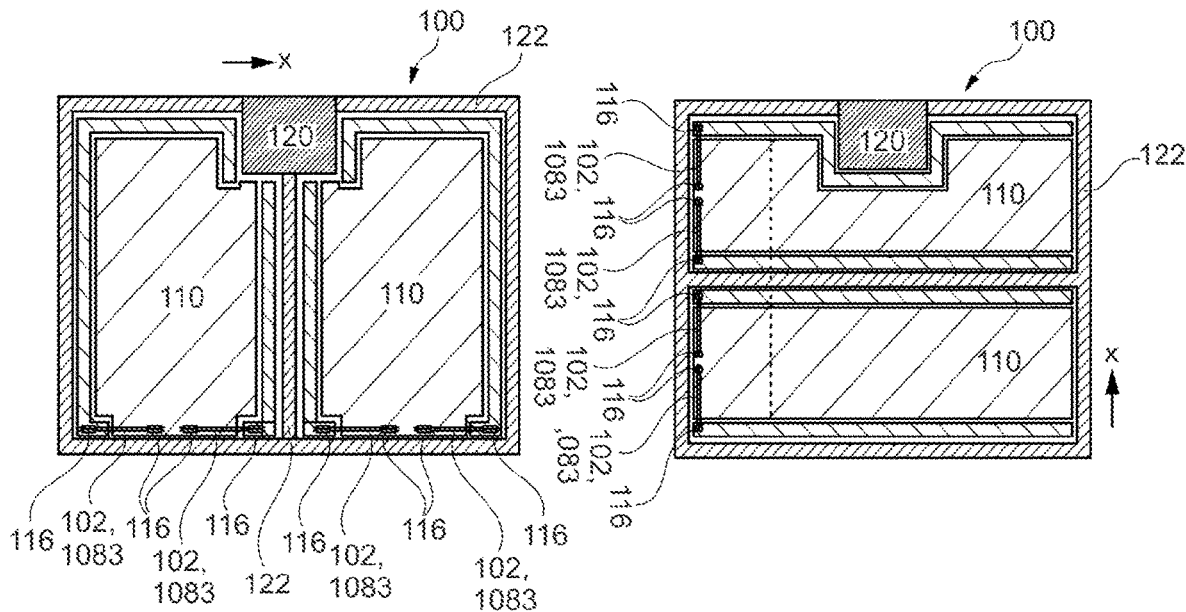
Figures 2H, 2I:
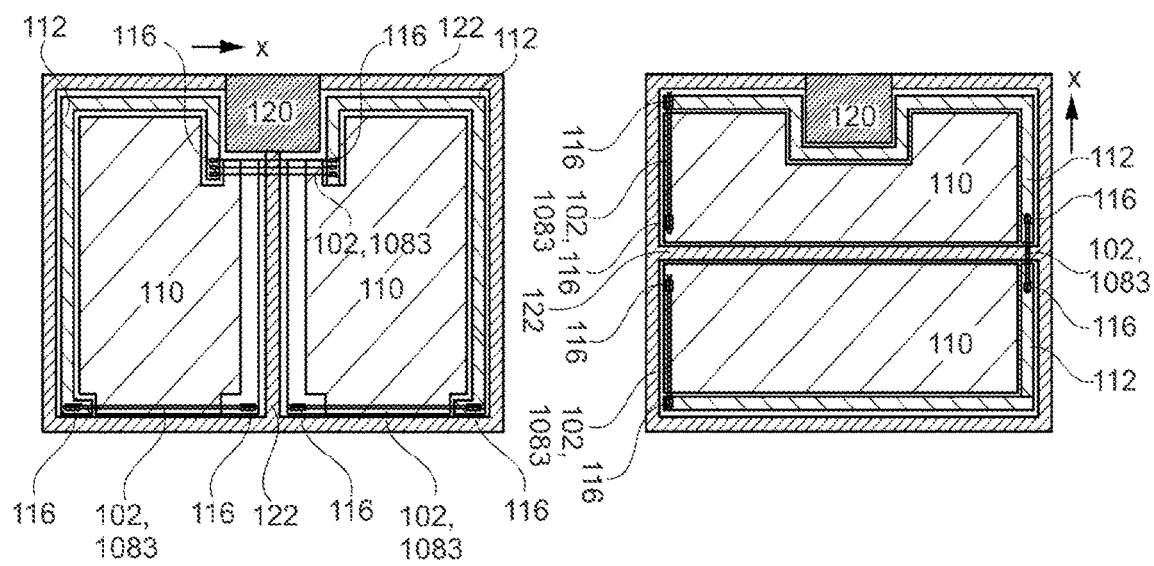

In the schematic top views of FIGS. 2A to 2C a longitudinal direction of the trenches 102 is the lateral direction x. For the sake of clarity, merely the auxiliary electrodes 1083 of some trenches 102 of the third group 1023 are illustrated. Each of the exemplary semiconductor devices 100 of FIGS. 2A to 2C includes a gate contact area 120 in a corner of the semiconductor body 104 or chip. A gate wiring line 122 surrounds the source contact area 110 and merges with the gate contact area 120. The gate wiring line 122 is electrically connected to the gate electrodes 1081 of the first group 1021 of the trenches 102 by contacts (not illustrated in FIGS. 2A to 2C). Source electrodes 1082 of the second group 1022 of trenches 102 are resistively coupled to the source contact area 110 by the source wiring line 102 and the auxiliary electrodes 1083 of the second group 1023 of the trenches 102. Second source electrodes 1084 of the fourth group 1084 of the trenches 102 can be directly electrically connected to the source contact area 110 by contacts between them. The semiconductor device 100 having the layout illustrated in FIG. 2B further includes a second source wiring line 124 that is merged with the source contact area 110. The source wiring line 112 is arranged laterally between the second source wiring line 124 and the source contact area 110. The second source wiring line 124 may support electric screening between the source wiring line 112 and the gate contact area 120/the gate wiring line 122. Moreover, the second source wiring line 124 may be electrically connected to at least some of the mesa regions 114 and/or to at least some of the second source electrodes 1084 of the fourth group 1024 of the trenches 102.

The layout illustrated in FIG. 2C may be beneficial with respect to area consumption of the source wiring line 112 compared with the layout of FIG. 2A.

In the schematic top views of FIGS. 2D to 2I, the gate contact area 120 is arranged at a center of an edge of the chip or semiconductor body. The schematic layouts illustrated in FIGS. 2D to 2G include two source contact areas 110. For each source contact area 110, the source electrodes 1082 of the second group 1022 are electrically connected via parts of source wiring line 112 arranged at opposite edges of the respective source contact area 110. The layout illustrated in FIG. 2F may be beneficial with respect to area consumption of the source wiring line 112 compared with the layout of FIG. 2D. Likewise, the layout illustrated in FIG. 2G may be beneficial with respect to area consumption of the source wiring line 112 compared with the layout of FIG. 2E. Moreover, the layout illustrated in FIG. 2H may be beneficial with respect to area consumption of the source wiring line 112 compared with the layout of FIG. 2F. Likewise, the layout illustrated in FIG. 2I may be beneficial with respect to area consumption of the source wiring line 112 compared with the layout of FIG. 2G.

Figure 3A:
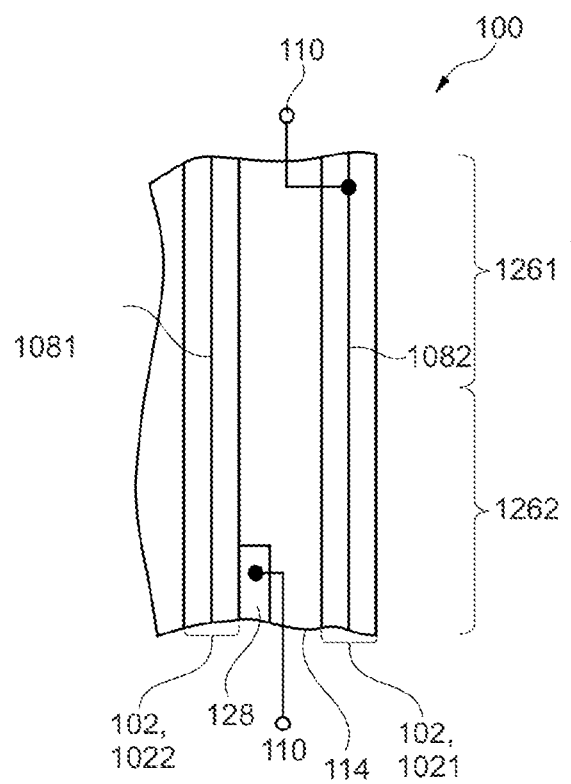
FIGS. 3A to 3C, 4 and 5 are schematic plan and cross-sectional views for illustrating other examples of a semiconductor device including a resistive coupling between a source electrode and a source contact area.
Figures 3B, 3C:
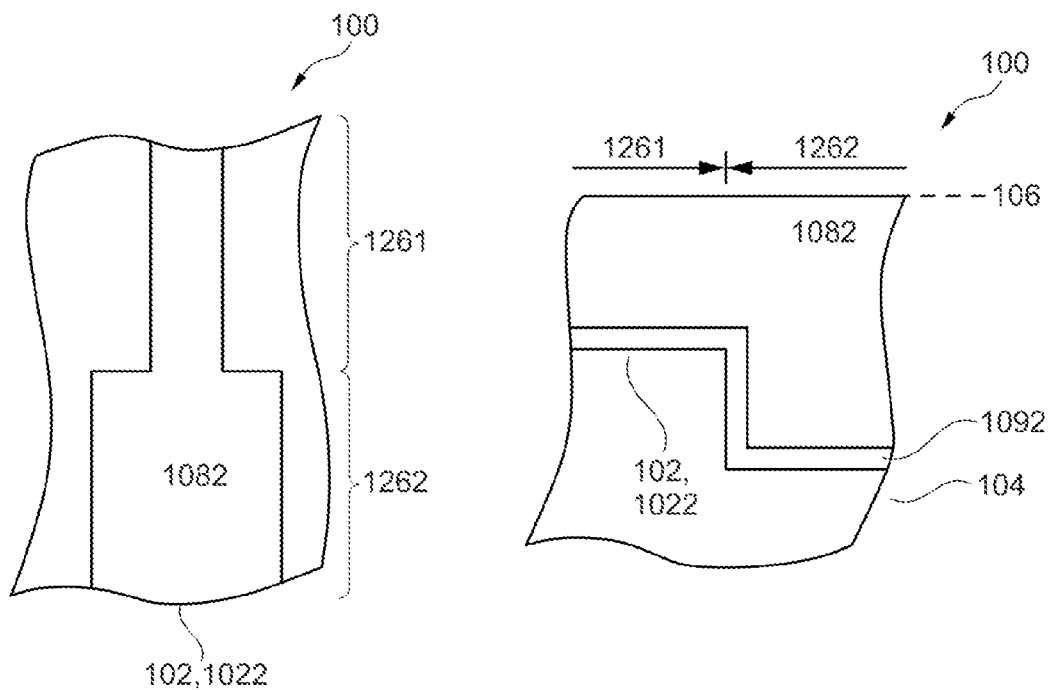

Another example of a semiconductor device 100 is illustrated in the schematic plan views of FIGS. 3A, 3B and the schematic cross-sectional view of FIG. 3C.

Similar to the previous examples, the semiconductor device 100 includes a plurality of trenches 102 extending into a semiconductor body 104 from a first main surface 106, wherein a first group 1021 of the plurality of trenches 102 includes a gate electrode 1081, and a second group 1022 of the plurality of trenches 102 includes a source electrode 1082.

The source electrode 1082 is subdivided into at least a first part 1261 and a second part 1262. A conductance per unit length of the first part 1261 along a longitudinal direction x of the source electrode 1082 is smaller than a conductance per unit length of the second part 1262 along the longitudinal direction x of the source electrode 1082.

The second part 1262 of the source electrode 1082 is electrically coupled to a source contact area 110 via the first part 1261. In the schematic view of FIG. 3A, the source contact area 110 is schematically illustrated by a terminal. The first part 1261 may be electrically connected to a source wiring line 112 by a contact 116, or may be directly connected to the source contact area 110 by a contact 116, for example.

The semiconductor device 100 further includes a mesa region 114 bounded by a trench 102 of the first group 1021 and a trench 102 of the second group 1022. The mesa region 114 includes a source region 128 electrically connected to the source contact area 110.

Referring to the schematic plan view of FIG. 3B, a width of the source electrode 1082 at the first main surface 106 in the first part 1261 is smaller than in the second part 1262. This allows for a decrease of a conductance per unit length of the first part 1261 along the longitudinal direction x of the source electrode 1082 compared with the second part 1262.

In addition or as an alternative to the example of FIG. 3B, the schematic cross-sectional view of FIG. 3C, which is taken along the lateral direction x of the source electrode 1082, is one example of a semiconductor device having a vertical extent of the source electrode 1082 in the first part 1261 that is smaller than in the second part 1262 by forming the trench 102 of the second group 1082 in the first part 1261 more shallow than in the second part 1062.

Figure 4:
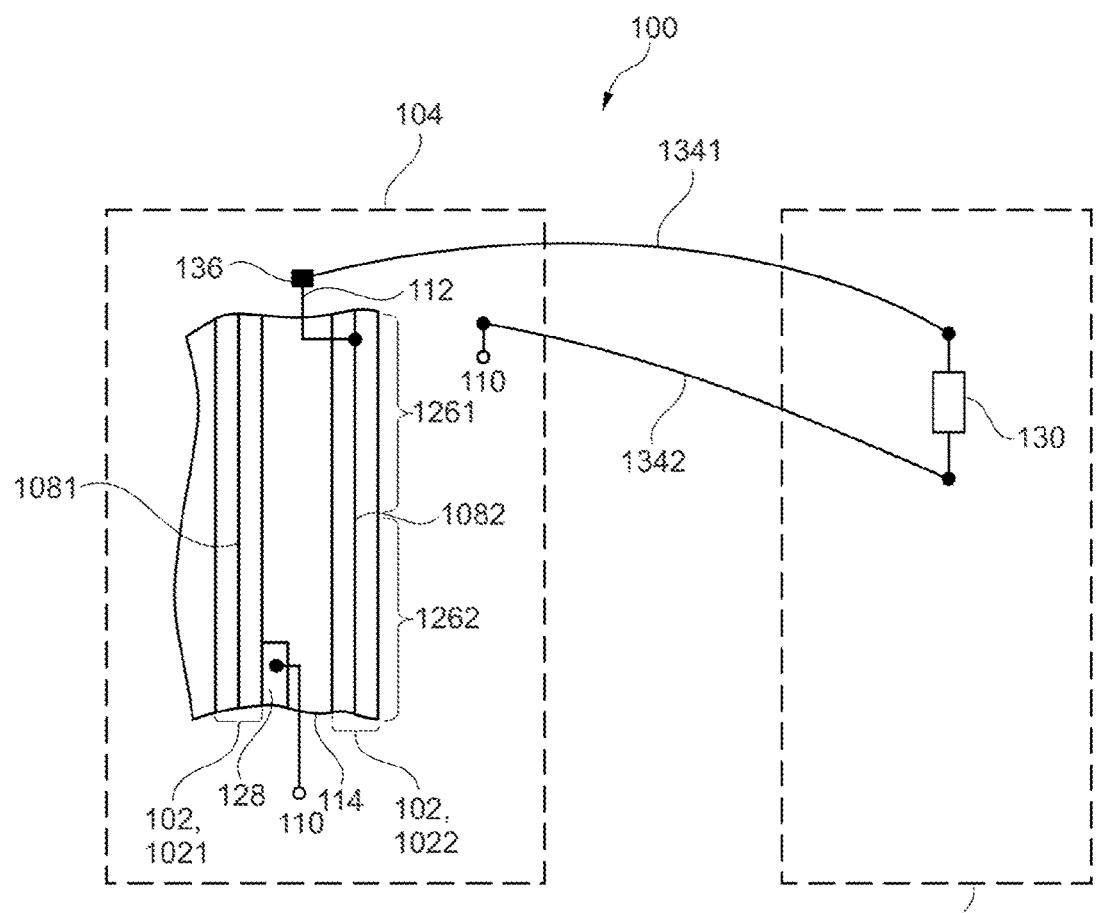

Another example of a semiconductor device 100 is illustrated in the schematic plan views of FIG. 4.

Similar to the previous examples, the semiconductor device 100 includes a plurality of trenches 102 extending into a semiconductor body 104 from a first main surface 106, wherein a first group 1021 of the plurality of trenches 102 includes a gate electrode 1081, and a second group 1022 of the plurality of trenches 102 includes a source electrode 1082.

The source electrode 1082 in the second group 1022 is electrically coupled to a source contact area 110 via a source wiring line 112 and a resistor 130 placed on a substrate 132 different from the semiconductor body 104. The source wiring line 112 and the resistor 130 are connected in series between the source contact area 110 and the source electrode 1082 in the second group 1022. Bond wires 1341, 1342 may provide an electric connection between an auxiliary source contact area 136 in the wiring area above the semiconductor body 104 and the substrate 132. However, other interconnection techniques, e.g. solder bonds, through silicon vias may be used.

Another example may include an additional connection pad with a resistor formed as a resistive wiring line connected to the additional pad. The additional pad is electrically connected to the source contact area, e.g. by a bond wire. In this example the resistor may be implemented as the source wiring line.

Figure 5:
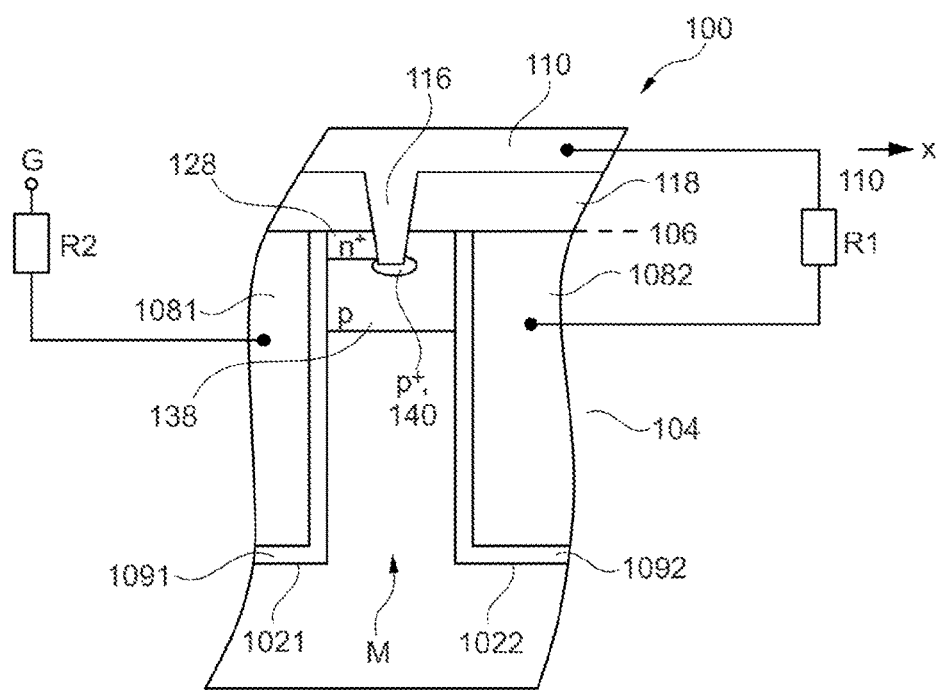

The schematic cross-sectional view of FIG. 5 illustrates a semiconductor device 100, e.g. an IGBT, having a mesa region 114 laterally confined by a trench 102 of the first group 1021 and a trench 102 of the second group 1022. The mesa region 114 includes an $n^+$-doped source region 128 electrically connected to the source contact area 110 by the contact 116. The source region 128 adjoins the first trench dielectric 1091. The mesa region 114 further includes a p-doped body region 138 and a $p^+$-doped body contact region 140 arranged between the body region 138 and the contact 116. The $p^+$-doped body contact region 140 aims at providing an ohmic contact between the body region 138 and the contact 116. The $p^+$-doped body contact region 140 may be omitted in case the doping concentration of the body region 138 is high enough for ensuring ohmic contact properties. In the example illustrated in FIG. 5, the contact is a groove contact 116 that extends into the semiconductor body 104 and is electrically connected to the body region 138 and to the source region 128. As an alternative or in addition to a groove contact, a planar contact may be formed (not illustrated). The planar contact may be electrically connected to the source region 128 and to the body region 138 or to the body contact region 140 at the first main surface 104, for example.

A conductivity of a channel close to an interface between the body region 138 and the trench dielectric 1091 may be controlled by a voltage applied to the gate electrode 1081 via a gate terminal G, for example.

The source electrode 1082 in the second group 1022 of the plurality of trenches may be electrically coupled to the source contact area 110, e.g. a first load terminal, via a first conductive path having a resistance R1. The gate electrode 1081 in the first group of the plurality of trenches may be electrically coupled to a gate contact or the gate terminal G by a second conductive path having a resistance R2. The resistance R2 may be at least a factor of five, or a factor of ten higher than the resistance R1, and may be not more than a factor of hundred, or not more than a factor of thousand higher than the resistance R1.

The aspects and features mentioned and described together with one or more of the previously described examples and figures, may as well be combined with one or more of the other examples in order to replace a like feature of the other example or in order to additionally introduce the feature to the other example.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a plurality of trenches extending into in a semiconductor body from a first main surface,
   wherein a first group of the plurality of trenches includes a gate electrode, a second group of the plurality of trenches includes a source electrode, and a third group of the plurality of trenches includes an auxiliary electrode,
   wherein the source electrode is electrically coupled to a source contact area via a source wiring line and the auxiliary electrode, and the source wiring line and the auxiliary electrode are electrically connected in series between the source contact area and the source electrode, and
   wherein the source wiring line extends in parallel to at least two edges of the source contact area.

2. The semiconductor device of claim 1, wherein the source wiring line and the source contact area are separate parts of a patterned wiring layer.

3. The semiconductor device of claim 1, wherein a ratio between a number of trenches in the second group and a number of trenches in the third group ranges from 100 to 100,000.

4. The semiconductor device of claim 1, wherein the source wiring line laterally surrounds at least a quarter of a circumference of the source contact area.

5. The semiconductor device of claim 1, further comprising:
   a gate wiring line,
   wherein the source wiring line is arranged between the gate wiring line and the source contact area, and
   wherein the gate wiring line extends in parallel to at least two edges of the source wiring line.

6. The semiconductor device of claim 5, further comprising:
   a second source wiring line,
   wherein the second source wiring line is merged with the source contact area,
   wherein the source wiring line is arranged between the second source wiring line and the source contact area, and is completely or predominantly laterally surrounded by the second source wiring line and the source contact area.

7. The semiconductor device of claim 6, further comprising:
   a plurality of contacts arranged between the second source wiring line and the first main surface,
   wherein the plurality of contacts electrically connect a plurality of mesa regions to the second source wiring line, and
   wherein each of the plurality of mesa regions is laterally confined by neighboring trenches of the plurality of trenches.

8. The semiconductor device of claim 1, wherein auxiliary electrodes in the third group are connected in parallel between the source wiring line and the source contact area, and wherein a total resistance of the auxiliary electrodes connected in parallel ranges from 50 to 500 times a resistance between the gate electrode and a gate terminal multiplied by a ratio between a total sum of longitudinal extensions of all trenches of the first group and a total sum of longitudinal extensions of all trenches of the second group.

9. The semiconductor device of claim 1, further comprising:
   a mesa region laterally confined by a trench of the first group and a trench of the second group,
   wherein the mesa region includes a source region.

10. The semiconductor device of claim 1, wherein a conductance per unit length of the auxiliary electrode along a longitudinal direction of the plurality of trenches is smaller than a conductance per unit length of the gate electrode along the longitudinal direction of the plurality of trenches.

* * * * *

UNITED STATES PATENT AND TRADEMARK OFFICE
CERTIFICATE OF CORRECTION

| | | |
|---|---|---|
| PATENT NO. | : 12,074,212 B2 | Page 1 of 1 |
| APPLICATION NO. | : 17/391562 | |
| DATED | : August 27, 2024 | |
| INVENTOR(S) | : C. Sandow et al. | |

It is certified that error appears in the above-identified patent and that said Letters Patent is hereby corrected as shown below:

On the Title Page

Item (57) Abstract, Line 2, please change "into in a" to -- into a --

In the Claims

Column 13, Line 24, (Claim 1, Line 2) please change "into in a" to -- into a --

Signed and Sealed this
First Day of April, 2025

Coke Morgan Stewart
*Acting Director of the United States Patent and Trademark Office*